United States Patent
Corso et al.

(10) Patent No.: US 9,618,578 B2
(45) Date of Patent: Apr. 11, 2017

(54) SEMICONDUCTOR STORAGE DEVICE HAVING SYNCHRONOUS AND ASYNCHRONOUS MODES

(71) Applicant: FREESCALE SEMICONDUCTOR, INC., Austin, TX (US)

(72) Inventors: Jorge Corso, Austin, TX (US); Marcos C. Barros, Santa Barbara d'Oeste (BR); Alexandre S. Lujan, Campinas (BR)

(73) Assignee: NXP USA, INC., Austin, TX (US)

( * ) Notice: Subject to any disclaimer, the term of this patent is extended or adjusted under 35 U.S.C. 154(b) by 110 days.

(21) Appl. No.: 14/638,458

(22) Filed: Mar. 4, 2015

(65) Prior Publication Data

US 2016/0259001 A1    Sep. 8, 2016

(51) Int. Cl.
*G01R 31/3177* (2006.01)
*G01R 31/3185* (2006.01)
*G11C 29/32* (2006.01)

(52) U.S. Cl.
CPC . *G01R 31/3177* (2013.01); *G01R 31/318541* (2013.01); *G01R 31/318575* (2013.01); *G01R 31/318594* (2013.01); *G11C 29/32* (2013.01)

(58) Field of Classification Search
None
See application file for complete search history.

(56) References Cited

U.S. PATENT DOCUMENTS

| | | | | |
|---|---|---|---|---|
| 6,393,592 | B1* | 5/2002 | Peeters | G01R 31/318541 714/727 |
| 7,155,649 | B2* | 12/2006 | Nakao | G01R 31/318536 714/726 |
| 7,274,233 | B2 | 9/2007 | Branch et al. | |
| 7,437,634 | B2 | 10/2008 | Jaber et al. | |
| 7,831,877 | B2 | 11/2010 | Sul et al. | |
| 2003/0016042 | A1 | 1/2003 | Parker | |
| 2010/0185909 | A1* | 7/2010 | Li | G01R 31/318572 714/726 |

OTHER PUBLICATIONS

Wang et al., "System-on-Chip Test Architectures, Nanometer Design for Testability, A volume in Systems on Silicon", Edited by: Wang et al (Chapter 7—Low-Power Testing; Girard et al.), ISBN: 978-0-12-373973-5, Copyright © 2008 Elsevier Inc.*
Huang et al., "A token scan architecture for low power testing", International Test Conference, Oct. 30-Nov. 1, 2001, pp. 660-669, IEEE, Baltimore, MD.*
Huang et al, "A token scan architecture for low power testing", International Test Conference, Oct. 30-Nov. 1, 2001, pp. 660-669, IEEE, Baltimore, MD.
Extended European Search Report dated Jul. 20, 2016 in EP Application No. 16158204.4.

* cited by examiner

*Primary Examiner* — April Y Blair
*Assistant Examiner* — Rong Tang

(57) ABSTRACT

A method for performing scan testing using a scan chain having a plurality of storage elements is described. During a capture phase, each storage element of the scan chain stores data from a first data input of the storage element synchronously to a clock signal. And during a shift phase, a scan pattern is shifted into the scan chain in which each storage element stores data from a second data input of the storage element asynchronously with to the clock signal.

19 Claims, 3 Drawing Sheets

SEMICONDUCTOR STORAGE DEVICE HAVING SYNCHRONOUS AND ASYNCHRONOUS MODES

BACKGROUND

Field

This disclosure relates generally to testing of integrated circuits, and more specifically, to storage elements used in scan testing.

Related Art

Today many integrated circuits incorporate design for test (DFT) techniques such as scan testing. Scan testing features can include a collection of flip-flops interconnected in the form of a scan chain. To minimize test time of complex integrated circuits, several short scan chains can be configured in parallel rather than using one long scan chain. In a scan test mode, each scan chain can be configured as a single shift register with a common clock. In this configuration, a scan controller can synchronously shift test data through each scan chain simultaneously. The resulting power consumption during a scan test mode therefore can be significantly larger than during a functional operation mode. To accommodate large scan test mode power consumption, the size of power grids is increased, which consequently increases overall die area and product costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Flip-flops used in scan testing may be referred to as "scan flops". A scan flop can be arranged as a multiplexer added at the data input of a typical D-flip-flop such that a select input of the multiplexer can be used to select between a first data input and a second data input. The select input of the multiplexer is generally characterized as the scan enable (SE) input of the scan flop, and can select the first data input during a functional operation mode and can select the second data input as the scan data input (SDI) during a scan test mode. For example, the SE input receives a first logic value when in the scan test mode and allows the scan flops of each scan chain to function as a shift register having a common clock. In contrast, when in the functional operation mode, the scan flops in each chain may be configured as functional registers and could have clocks from different clock domains. The clock trees of the scan flops in each scan chain are balanced during an integrated circuit's integration phase, adding buffers to clocks where needed to minimize clock skew. However, the added buffers to balance the clocks of the scan flops in the scan test mode configuration also adds delay to clocks and increases power consumption during functional operation modes.

The present disclosure describes a storage element which can be employed in scan chains to allow for reduced functional power consumption and to allow for distributed shift power consumption by taking advantage of the asynchronous capability and the synchronous capability of the storage element. When the scan chains are configured for asynchronous shift operations, power is distributed minimizing large current spikes. When the scan chains are configured for synchronous operations, power is reduced because fewer clock buffers are needed to balance clocks.

Figure 1:
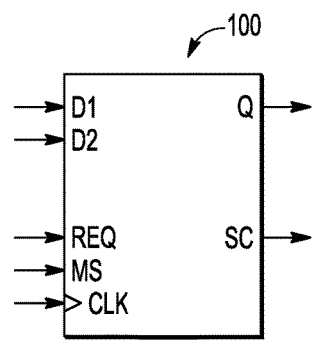
FIG. 1 is a schematic symbol for a storage element having a synchronous mode and an asynchronous mode in accordance with an embodiment of the present disclosure.

FIG. 1 illustrates a schematic symbol for a storage element 100 having a synchronous mode and an asynchronous mode in accordance with an embodiment of the present disclosure. Storage element 100 includes data inputs D1 and D2 for receiving data, a data multiplexer selection input MS, a request input REQ for receiving a storage request, a clock input CLK, a storage complete output SC for indicating that the storage operation completed, and a data output Q for outputting stored data. The function of the storage element 100 can be controlled via the REQ, CLK, and MS inputs. In a synchronous mode example, while the REQ input receives a first logic value, the storage element 100 can store data at a selected input according to a typical flip-flop being clocked by the signal received at the CLK input. In an asynchronous mode example, while the CLK input receives a first logic value, the storage element 100 can store data at a selected input based on requests received at the REQ input.

Figure 2:
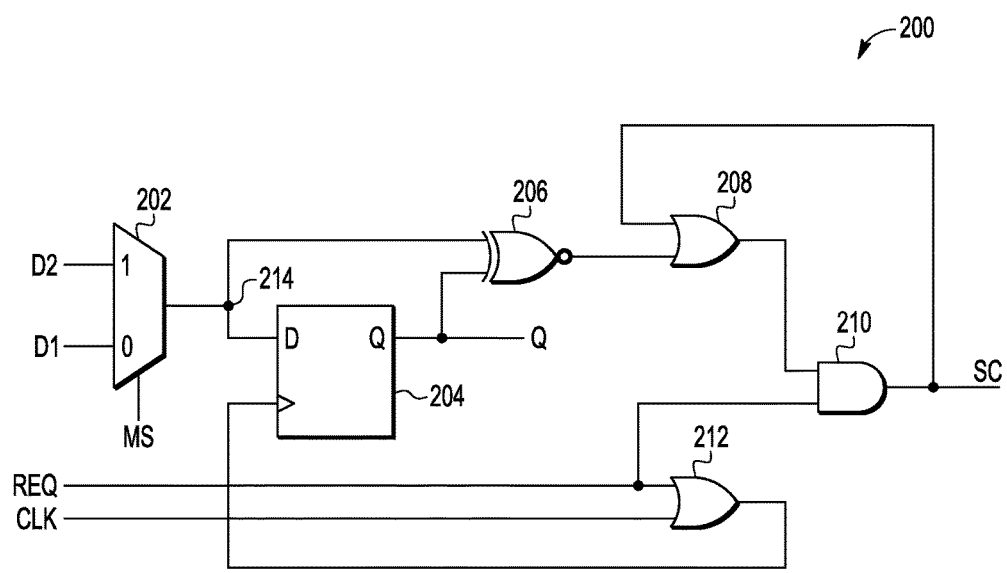
FIG. 2 is a schematic diagram of a storage element having exemplary logic circuitry in accordance with an embodiment of the present disclosure.

FIG. 2 is a schematic diagram of a storage element 200 having exemplary logic circuitry in accordance with an embodiment of the present disclosure. Alternative circuits may be used to implement a storage element in accordance with an embodiment of the present disclosure. Storage element 200 has a first data input D1 and a second data input D2, a data multiplexer selection input MS, a request input REQ, a clock input CLK, a storage complete output SC, and a data output Q. Multiplexer 202 provides a selection of data at inputs D1 or D2 based on the logic value received at input MS. For example, when the MS input receives a first logic value, input D1 is coupled to the multiplexer output 214 and when DS input receives a second logic value, input D2 is coupled to the multiplexer output 214. In some embodiments, the storage element 200 may have one data input in which case the multiplexer 202 can be omitted. In some embodiments, the storage element 200 may have more than two data inputs. The multiplexer output 214 is coupled to a first input of exclusive NOR gate (XNOR) 206 and to the data input of flip-flop 204. An output of flip-flop 204 (Q) provides the stored data output of the storage cell 200 and is coupled to a second input of XNOR gate 206. The output of XNOR gate 206 is coupled to a first input of OR gate 208. A request input REQ is coupled to a first input of AND gate 210 and to a first input of OR gate 212. The output of OR gate 208 is coupled to a second input of AND gate 210. The output of AND gate 210 is coupled to a second input of OR gate 208 and provides an indication that a storage operation is complete (SC). A clock signal is provided at a second input (CLK) of OR gate 212. The output of OR gate 212 provides a version of the clock signal and is coupled to the clock input of flip-flop 204.

The request and clock signals received at the REQ and CLK inputs respectively may be used to control whether the storage element 200 operates in a synchronous mode or in an asynchronous mode. For a synchronous mode example, when the request signal is at a first logic value, the clock signal passes through OR gate 212 and can be used to clock flip-flop 204. While in synchronous mode, the selected data outputted from multiplexer 202 can be captured and stored on a first edge of the clock provided to flip-flop 204. The stored data can be outputted at output Q. For an asynchronous mode example, when the clock signal is at a first logic value, the request signal can be used to store the selected data asynchronously.

Figure 3:
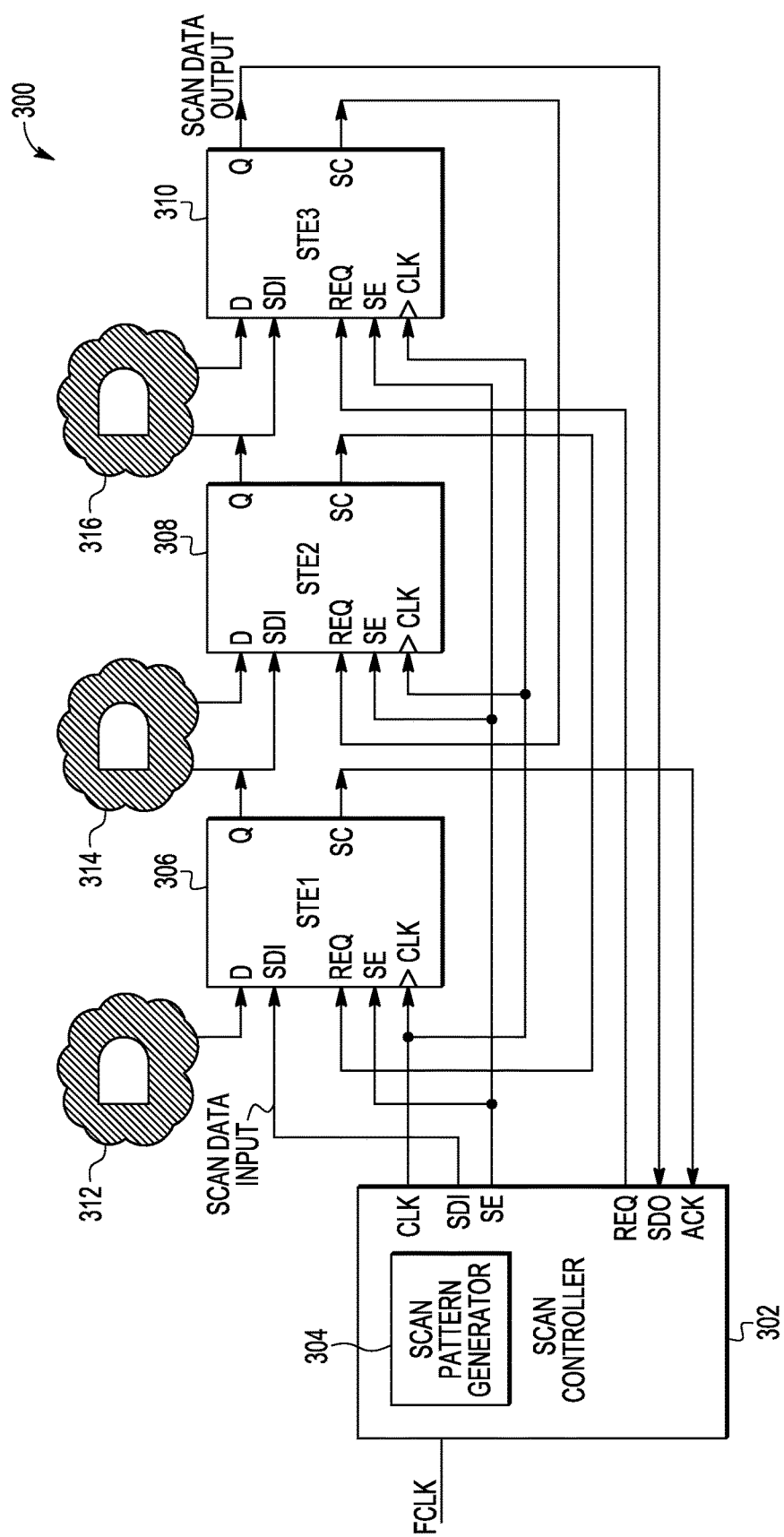
FIG. 3 is a schematic diagram of an example scan test circuit having a synchronous mode and an asynchronous mode in accordance with an embodiment of the present disclosure.

FIG. 3 is a schematic diagram of an example scan test circuit 300 having a synchronous mode and an asynchronous mode in accordance with an embodiment of the present disclosure. The scan test circuit 300 includes a scan controller 302 and a scan chain having at least a first storage element 306 and last storage element 310. One or more intermediate storage element(s) 308 is coupled between the first storage element and the last storage element. In some embodiments, the scan test circuit may include multiple scan chains. The scan controller 302 can include a scan pattern generator unit 304 to generate one or more scan patterns wherein each scan pattern includes test data for shifting a series of data bits into the scan chain. In some embodiments, the one or more scan patterns may be generated on the integrated circuit. In some embodiments, the one or more scan patterns may be stored off-chip. In some embodiments, the scan pattern generator unit can include a pseudo-random pattern generator. In some embodiments, the scan pattern generator unit can include a memory for storing the one or more scan patterns.

The scan controller 302 includes a clock input FCLK for receiving a function clock, an SDO input for receiving scan data output from the scan chain, an acknowledge input ACK for receiving an indication that scan data has been shifted into the first storage element of the scan chain, a clock output CLK coupled to the clock inputs of the scan elements, an SDI output to provide scan data in for the scan chain, a data select output SE for selecting the first data input or the second data input of the storage elements, and a request output REQ for requesting storage of data at the selected data input. In some embodiments, the scan controller may be configured to use external scan patterns such as those provided by a tester for example.

In this embodiment, the scan chain includes the first data input D of the first storage element 306 coupled to a first logic circuit 312 and the second data input SDI coupled to receive scan pattern data from the scan controller 302. The Q output of storage element 306 is coupled to the SDI input of the intermediate storage element 308 and coupled to a second logic circuit 314. The REQ input of the first storage element 306 is coupled to the SC output of the intermediate storage element 308. The SC output of the first storage element 306 is coupled to the ACK input of the scan controller 302. The ACK input receives an acknowledge indication from the storage complete output of the first storage element indicating that a scan pattern data bit has been shifted into the scan chain. The D input of the intermediate storage element 308 is coupled to the second logic circuit 314. The Q output of storage element 308 is coupled to a third logic circuit 316 and coupled to the SDI input of the last storage element 310. The REQ input of the intermediate storage element 308 is coupled to the SC output of the last storage element 310. The D input of the last storage element 310 is coupled to the third logic circuit 316 and the Q output is coupled to the scan controller 302 at the scan data out SDO input wherein the scan controller receives scan data output from the scan chain.

Figure 4:
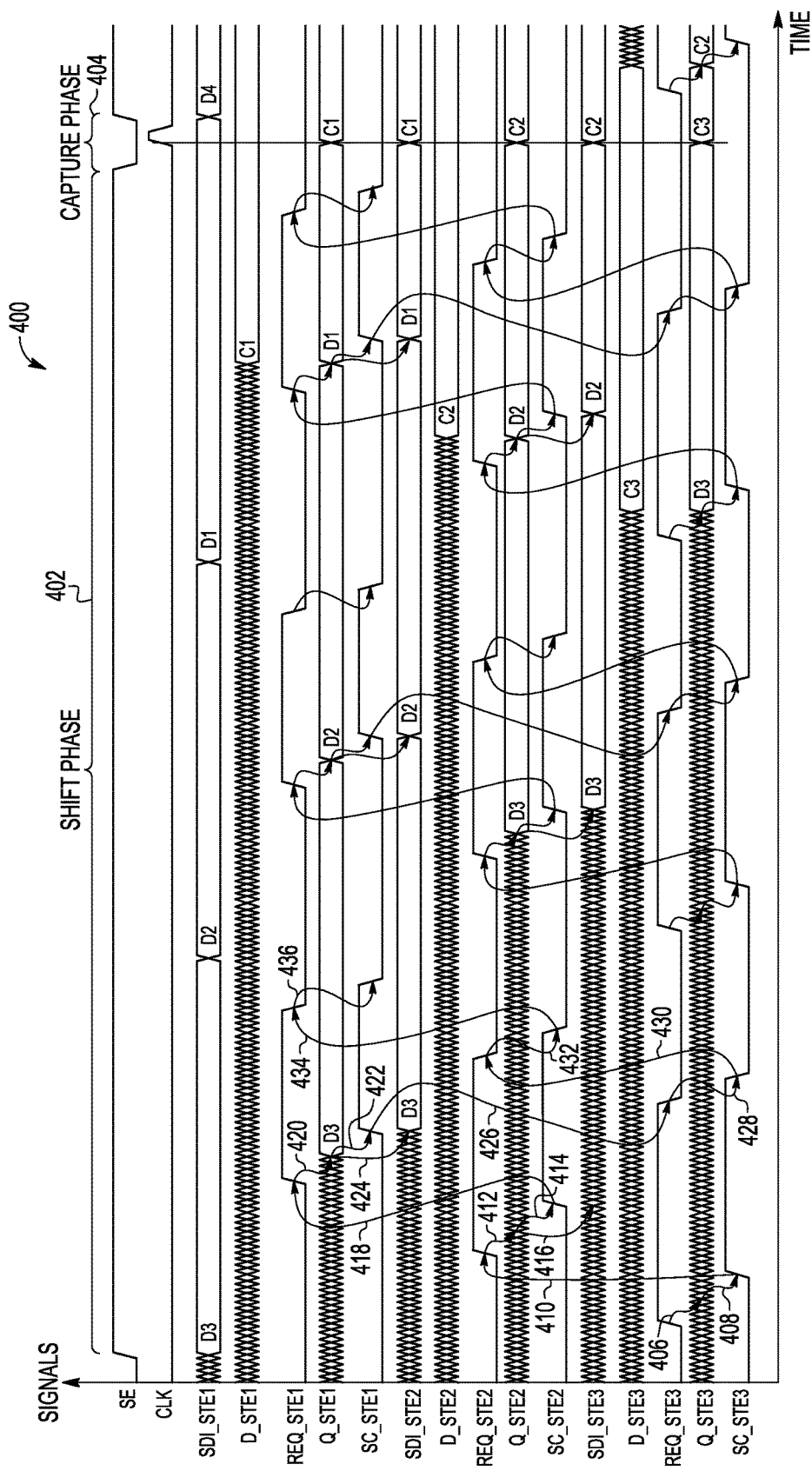
FIG. 4 is a timing diagram in accordance with an example operation of the scan test circuit illustrated in FIG. 3.

FIG. 4 is a timing diagram 400 in accordance with an example operation of the scan test circuit 300 illustrated in FIG. 3. The timing diagram 400 includes timing waveforms shown in two phases of a scan test operation—a shift phase 402 and a capture phase 404. Dependency arrows 406-436 illustrate waveforms resulting from dependencies on other signal transitions.

Referring to FIGS. 3 and 4. In a shift phase example, the scan controller 302 configures the SE output for scan test mode and selects the SDI input as the data input for the storage elements 306, 308, and 310. In this example, the SE waveform in FIG. 4 is illustrated as a logic level high during the shift phase. While in the shift phase 402, a scan pattern is shifted into the scan chain in which each storage element stores data from the SDI input of the storage element asynchronously to the clock signal (waveform CLK in FIG. 4).

The scan controller 302 provides a first data bit D3 of the scan pattern at the SDI input of the first storage element 306 of the scan chain and asserts a request signal at the REQ output to initiate a first stage shift for the first data bit at the last storage element 310 of the scan chain. Storage element 310 stores the data value at the SDI input and outputs the stored data value on the Q output. Dependency 406 shows output data on waveform Q_STE3 depending from the rising edge of waveform REQ_STE3. In this example, indeterminate data is shown in a first portion of the SDI_STE3 waveform because the scan pattern data has not yet propagated to the SDI input of storage element 310. The indeterminate data at the SDI input is stored at the first rising edge of REQ_STE3 which causes indeterminate data to be output at the Q output of storage element 310 as shown in the Q_STE3 waveform. When the stored data value is outputted at the Q output and the data value at the SDI input matches the data value at the Q output, the SC output of storage element 310 asserts (see timing dependency 408) and provides indication that the first stage shift is complete. Since the SC output of storage element 310 is coupled to the REQ input of intermediate storage element 308, the REQ input of storage element 308 receives the indication that the first stage shift has completed (as shown in dependency 410) when the SC output of storage element 310 is asserted.

When the REQ input of the intermediate storage element 308 receives a shift complete indication from the SC output of storage element 310, a second stage shift for the first data bit D3 is initiated at storage element 308. Intermediate storage element 308 stores the data value at the SDI input and outputs the stored data value on the Q output. Dependency 412 shows output data on waveform Q_STE2 depending from the rising edge of waveform REQ_STE2. In this example, indeterminate data is shown in a first portion of the SDI_STE2 waveform because the scan pattern data has not yet propagated to the SDI input of the intermediate storage element 308. The indeterminate data at the SDI input is stored at the first rising edge of the REQ_STE2 waveform which causes indeterminate data to be output at the Q output of storage element 308 as shown in the Q_STE2 waveform. When the stored data value is outputted at the Q output and the data value at the SDI input matches the data value at the Q output, the SC output of storage element 308 asserts as shown in timing dependency 414 and provides indication that the second stage shift is complete. Since the SC output of the intermediate storage element 308 is coupled to the REQ input of the first storage element 306, the REQ input receives the indication that the second shift operation has completed (as shown in dependency 418) when the SC output is asserted.

When the REQ input of the first storage element 306 receives a shift complete indication from the SC output of storage element 308, a third stage shift for the first data bit D3 is initiated at the first storage element 306. The first storage element 306 stores the data value (D3 shown in waveform SDI_STE1) at the SDI input and outputs the stored data value on the Q output. Dependency 420 shows output data D3 on waveform Q_STE1 depending from the rising edge of waveform REQ_STE1. The first data bit D3 is provided at the SDI input. When the stored data value is outputted at the Q output and the data at the SDI input matches the data at the Q output, the SC output of the first storage element 306 asserts as shown in timing dependency 422 and provides indication that the third stage shift has completed. Since the SC output of the first storage element 306 is coupled to the ACK input of the scan controller 302, the ACK input receives the indication that the third stage shift for the first data bit D3 has completed when the SC output is asserted. At this point in the shift phase, the first data bit D3 of the scan pattern has been shifted into the first storage element 306 of the scan chain. When the ACK input receives the indication that the third stage shift has completed, then the request signal is deasserted to the REQ input of the last storage element 310 as shown in dependency 426.

After deasserting the request signal at the REQ input of the last storage element 310, the SC output of the last storage element 310 is deasserted (dependency 428). Because the SC output of the last storage element 310 deasserts, the coupled REQ input of the intermediate storage element 308 also deasserts (dependency 430). After the REQ input of the intermediate storage element 308 deasserts, the SC output of the intermediate storage element 308 deasserts (dependency 432). Because the SC output of the intermediate storage element 308 deasserts, the coupled REQ input of the first storage element 306 also deasserts (dependency 434). After the REQ input of the first storage element 306 deasserts, the SC output of the first storage element 306 deasserts (dependency 436).

When the ACK input of the scan controller 302 receives the deasserted signal from the SC output of the first storage element 306, the scan controller 302 provides a second data bit D2 of the scan pattern at the SDI input of the first storage element 306 of the scan chain and asserts the request signal a second time at the REQ output to initiate a first stage shift for the second data bit D2 at the last storage element 310 of the scan chain. At storage element 310, the data value at the SDI input is stored and outputted at the Q output. When the data value at the Q output and the data value at the SDI input matches, the SC output of storage element 310 asserts a second time and provides indication that the first stage shift for the second data bit D2 is complete. When the SC output of storage element 310 is asserted, the REQ input of intermediate storage element 308 receives the shift complete indication and initiates a second stage shift for the second data bit D2. Intermediate storage element 308 stores the data value of the first data bit D3 at the SDI input and outputs the stored data value D3 on the Q output. When the data value at the Q output and the data value at the SDI input matches, the SC output of intermediate storage element 308 asserts a second time and provides indication that the second stage shift for the second data bit D2 is complete. Since the Q output of the intermediate storage element 308 is coupled to the SDI input of the last storage element 310, the first data bit D3 is provided at the SDI input. When the SC output of storage element 308 is asserted, the REQ input of first storage element 306 receives the shift complete indication and initiates a third stage shift for the second data bit D2.

First storage element 308 stores the data value of the second data bit D2 at the SDI input and outputs the stored data value D2 on the Q output. When the data value at the Q output and the data value at the SDI input matches, the SC output of first storage element 306 asserts a second time and provides indication to the ACK input of the scan controller that the third stage shift for the second data bit D2 is complete. At this point in the shift phase, second data bit D2 and first data bit D3 of the scan pattern have been shifted into consecutive storage elements 306, 308 of the scan chain. When the ACK input of the scan controller receives the indication that the third stage shift for the second data bit D2 has completed, then the scan controller deasserts the request signal at the REQ output.

After deasserting the request signal, the SC output of the last storage element 310 is deasserted. In a domino-like manner, the deasserted SC output signal is received at the REQ input of the intermediate storage element 308, causing the SC output of the intermediate storage element 308 to deassert. The deasserted SC output signal is received at the REQ input of the first storage element 306, causing the SC output of the first storage element 306 to deassert.

The ACK input of the scan controller 302 receives the deasserted signal from the SC output of the first storage element 306. The scan controller 302 then provides a third data bit D1 of the scan pattern at the SDI input of the first storage element 306 of the scan chain and asserts the request signal a third time at the REQ output to initiate a first stage shift for the third data bit D1 at the last storage element 310 of the scan chain. At storage element 310, the data value of the first data bit D3 at the SDI input is stored and outputs the stored data value D3 at the Q output. When the data value at the Q output and the data value at the SDI input matches, the SC output of storage element 310 asserts a third time and provides indication that the first stage shift for the third data bit D1 is complete. When the SC output of storage element 310 is asserted, the REQ input of intermediate storage element 308 receives the shift complete indication and initiates a second stage shift for the third data bit D1. Intermediate storage element 308 stores the data value of the second data bit D2 at the SDI input and outputs the stored data value D2 on the Q output. When the data value at the Q output and the data value at the SDI input matches, the SC output of intermediate storage element 308 asserts a third time and provides indication that the second stage shift for the third data bit D1 is complete. Since the Q output of the intermediate storage element 308 is coupled to the SDI input of the last storage element 310, the second data bit D2 is provided at the SDI input. When the SC output of storage element 308 is asserted, the REQ input of first storage element 306 receives the shift complete indication and initiates a third stage shift for the third data bit D1. First storage element 308 stores the data value of the third data bit D1 at the SDI input and outputs the stored data value D1 on the Q output. When the data value at the Q output and the data value at the SDI input matches, the SC output of first storage element 306 asserts a third time and provides indication to the ACK input of the scan controller that the third stage shift for the third data bit D1 is complete. At this point in the shift phase, third data bit D1, second data bit D2, and first data bit D3 of the scan pattern have been shifted into storage elements 306, 308, 310 of the scan chain respectively. When the ACK input of the scan controller receives the indication that the third stage shift for the third data bit D1 has completed, then the scan controller deasserts the request signal at the REQ output.

After deasserting the request signal, the SC output of the last storage element 310 is deasserted. The deasserted SC output signal is received at the REQ input of the intermediate storage element 308, causing the SC output of the intermediate storage element 308 to deassert. The deasserted SC output signal is received at the REQ input of the first storage element 306, causing the SC output of the first storage element 306 to deassert. The ACK input of the scan controller 302 receives the deasserted signal from the SC output of the first storage element 306 completing the scan phase.

In a capture phase 404 example, the scan controller 302 configures the SE output for capture mode, selecting the D input as the data input of the storage elements 306, 308, and 310. In this example, the SE waveform in FIG. 4 is illustrated as a logic level low during the capture phase 404. Each storage element 306, 308, 310 of the scan chain can store a data value at the data input D of the storage element synchronously to the clock signal at the CLK input. The D inputs of the storage elements 306, 308, 310 of the scan chain receive outputs from logic circuits 312, 314, and 316 respectively. In this example, data bits D1, D2, and D3 have been shifted into the scan chain and the resulting respective data outputs C1, C2, C3 from the logic circuits 312, 314, 316 are provided at the D inputs of the storage elements 306, 308, 310. The scan controller 302 generates a clock pulse on the CLK output which is coupled to each storage element 306, 308, 316. Each storage element 306, 308, 310 captures the data value present on the D inputs with the clock signal.

By now it should be appreciated that there has been provided a storage element which can be employed in scan chains to allow for reduced functional power consumption and to allow for distributed shift power consumption by taking advantage of the asynchronous capability and the synchronous capability of the storage element.

Generally, there is provided, a method for performing scan testing using a scan chain having a plurality of storage elements. The method includes: during a capture phase, each storage element of the scan chain storing data from a first data input of the storage element synchronously with a clock signal; and during a shift phase, shifting a scan pattern into the scan chain in which each storage element stores data from a second data input of the storage element asynchronously with the clock signal. Shifting the scan pattern into the scan chain may include: providing a first data bit of the scan pattern to a second data input of a first storage element of the scan chain; and asserting a request signal a first time at a request input of a last storage element of the scan chain, wherein the request signal initiates storage of a data value at the second data input of the last storage element into the last storage element. The scan chain may include an intermediate storage element coupled between the first storage element and the last storage element. Shifting the scan pattern into the scan chain may further include: when the last storage element of the scan chain completes the storage of the data value at the second data input of the last storage element, asserting a completion signal at a completion output of the last storage element; and providing the completion signal to a request input of the intermediate storage element, wherein, in response to assertion of the completion signal at the request input of the intermediate storage element, initiating storage of a data value at the second data input of the intermediate storage element into the intermediate storage element. The last storage element may determine that the storage of the data value is complete by determining that the data value at the second data input of the last storage element matches a data value at a data output of the last storage element. Shifting the scan pattern into the scan chain may further include: when a data value at the second data input of the first storage element matches a data output value of the first storage element, asserting a completion signal at a completion output of the first storage element to indicate that the first data bit has been shifted into the scan chain. After the asserting the completion signal at the completion output of the first storage element, deasserting the request signal at the request input of the last storage element. After the deasserting the request signal at the request input of the last storage element, the method may further include: providing a second data bit of the scan pattern to the scan data input of the first storage element of the scan chain; and asserting the request signal a second time at the request input of the last storage element of the scan chain. After the asserting the request signal the second time, the method may further include when a data value at the second data input of the first storage element matches a data output value of the first storage element, asserting the completion signal at the completion output of the first storage element to indicate that the second data bit has been shifted into the scan chain such that the scan chain includes the first data bit and the second data bit in consecutive storage elements. Shifting the scan pattern into the scan chain may further include prior to the asserting the completion signal, asserting a request signal at a request input of the first storage element of the scan chain to initiate storage of the data value at the scan data input of the first storage element into the first storage element.

In one embodiment, there is provided, an integrated circuit which includes: a scan test controller having a clock output configured to provide a clock signal, a request output configured to provide a request signal, and scan data output configured to provide scan patterns; and a scan chain having a plurality of storage elements includes a first storage element, a last storage element, and one or more intermediate storage elements between the first and last storage element, wherein each storage element includes a data input, a scan data input, a clock input, a request input, a data select input, a data output, and a storage complete output. The scan data input of a first storage element of the scan chain may be coupled to receive a scan pattern bit from the scan test controller and the storage complete output of the first storage element may be coupled to provide an acknowledge signal at the storage complete output to the scan test controller. The request input of a last storage element of the scan chain may be coupled to receive the request signal from the scan test controller, and the data output of the last storage element may be coupled to provided scan data output to the scan test controller. And for each intermediate storage element, the scan data input may be coupled to a data output of a preceding storage element, the data output may be coupled to a scan data input of a succeeding storage element, the request input may be coupled to a storage complete output of the succeeding storage element, and the storage complete output may be coupled to a request input of the preceding storage element. For each storage element of the plurality of storage elements, assertion of a request signal at the request input may initiate storage of a data value at the scan data input of the storage element into the storage element, and upon completion of the storage of the data value into the storage element, a storage completion signal may be asserted at the storage complete output. For each storage element of the plurality of storage elements, completion of the storage of the data value into the storage element may be indicated when the data value at the scan data input matches a data value at the data output of the storage element. During a capture phase, each storage element of the plurality of storage elements may store data values at the data input into the storage element synchronous to the clock signal, and, during a shift phase, each storage element of the plurality of storage elements may store a data value at the scan data input into the storage element asynchronous to the clock signal. For each storage element of the plurality of storage elements, the data input may be coupled to a first logic circuit, and the data output may be coupled to a second logic circuit. The first storage element may assert the acknowledge signal to indicate that a scan pattern bit of a scan pattern has been shifted into the scan chain.

In another embodiment, there is provided, a storage element having a synchronous mode and an asynchronous mode which includes: a first data input; a second data input; a clock input; a request input coupled to receive a storage request; a storage complete output coupled to provide a storage complete indicator; and a data output. During operation in the synchronous mode, data values from a selected one of the first data input or second data input may be stored into the storage element and provided at the data output synchronous to a clock signal at the clock input, and during operation in the asynchronous mode, storage of an input data value at a selected one of the first data input or second data input into the storage element may be initiated in response to assertion of the storage request, and in response to completing storage of the input data value into the storage element, the storage complete indicator may be asserted. The first data input may be coupled to receive data values from a first circuit, and the second data input may be coupled to receive data values from a second circuit, different from the first circuit. The storage element may further include a data select input coupled to receive a data select signal, wherein the selected one of the first data input or the second data input may be selected in response to the data select signal. During operation in the asynchronous mode, the clock signal at the clock input may be held at a predetermined value. During asynchronous mode, upon completing storage of the input data value, the input data value may be provided at the data output.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different integrated circuit test systems. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such element.

What is claimed is:

1. A method for performing scan testing using a scan chain having a plurality of storage elements, the method comprising:
   during a capture phase, each storage element of the scan chain storing data from a first data input of the storage element synchronously with a clock signal; and
   during a shift phase, shifting a scan pattern into the scan chain in which each storage element stores data from a second data input of the storage element asynchronously with the clock signal, the shifting the scan pattern into the scan chain comprises providing a first data bit of the scan pattern to a second data input of a first storage element of the scan chain, and asserting a request signal a first time at a request input of a last storage element of the scan chain, wherein the request signal initiates storage of a data value at the second data input of the last storage element into the last storage element.

2. The method of claim 1, wherein the scan chain comprises an intermediate storage element coupled between the first storage element and the last storage element, wherein the shifting the scan pattern into the scan chain further comprises:
   when the last storage element of the scan chain completes the storage of the data value at the second data input of the last storage element, asserting a completion signal at a completion output of the last storage element; and
   providing the completion signal to a request input of the intermediate storage element, wherein, in response to assertion of the completion signal at the request input of the intermediate storage element, initiating storage of a data value at the second data input of the intermediate storage element into the intermediate storage element.

3. The method of claim 2, wherein the last storage element determines that the storage of the data value is complete by determining that the data value at the second data input of the last storage element matches a data value at a data output of the last storage element.

4. The method of claim 1, wherein the shifting the scan pattern into the scan chain further comprises:
   when a data value at the second data input of the first storage element matches a data output value of the first storage element, asserting a completion signal at a completion output of the first storage element to indicate that the first data bit has been shifted into the scan chain.

5. The method of claim 4, wherein after the asserting the completion signal at the completion output of the first storage element, deasserting the request signal at the request input of the last storage element.

6. The method of claim 5, wherein after the deasserting the request signal at the request input of the last storage element, the method further comprises:
   providing a second data bit of the scan pattern to the scan data input of the first storage element of the scan chain; and
   asserting the request signal a second time at the request input of the last storage element of the scan chain.

7. The method of claim 6, wherein after the asserting the request signal the second time, the method further comprises:
   when a data value at the second data input of the first storage element matches a data output value of the first storage element, asserting the completion signal at the completion output of the first storage element to indicate that the second data bit has been shifted into the scan chain such that the scan chain includes the first data bit and the second data bit in consecutive storage elements.

8. The method of claim 7, wherein the shifting the scan pattern into the scan chain further comprises:
   prior to the asserting the completion signal, asserting a request signal at a request input of the first storage element of the scan chain to initiate storage of the data value at the scan data input of the first storage element into the first storage element.

9. An integrated circuit comprising:
   a scan test controller having a clock output configured to provide a clock signal, a request output configured to provide a request signal, and scan data output configured to provide scan patterns; and
   a scan chain having a plurality of storage elements includes a first storage element, a last storage element, and one or more intermediate storage elements between the first and last storage element, wherein each storage element includes a data input, a scan data input, a clock input, a request input, a data select input, a data output, and a storage complete output, wherein:
      the scan data input of a first storage element of the scan chain is coupled to receive a scan pattern bit from the scan test controller and the storage complete output of the first storage element is coupled to provide an acknowledge signal at the storage complete output to the scan test controller,
      the request input of a last storage element of the scan chain is coupled to receive the request signal from the scan test controller, and the data output of the last storage element is coupled to provided scan data output to the scan test controller, and
      for each intermediate storage element, the scan data input is coupled to a data output of a preceding storage element, the data output is coupled to a scan data input of a succeeding storage element, the request input is coupled to a storage complete output of the succeeding storage element, and the storage complete output is coupled to a request input of the preceding storage element.

10. The integrated circuit of claim 9, wherein, for each storage element of the plurality of storage elements, assertion of a request signal at the request input initiates storage of a data value at the scan data input of the storage element into the storage element, and upon completion of the storage of the data value into the storage element, a storage completion signal is asserted at the storage complete output.

11. The integrated circuit of claim 10, wherein, for each storage element of the plurality of storage elements, completion of the storage of the data value into the storage element is indicated when the data value at the scan data input matches a data value at the data output of the storage element.

12. The integrated circuit of claim 9, wherein, during a capture phase, each storage element of the plurality of storage elements stores data values at the data input into the storage element synchronous to the clock signal, and, during a shift phase, each storage element of the plurality of storage elements stores a data value at the scan data input into the storage element asynchronous to the clock signal.

13. The integrated circuit of claim 12, wherein, for each storage element of the plurality of storage elements, the data input is coupled to a first logic circuit, and the data output is coupled to a second logic circuit.

14. The integrated circuit of claim 9, wherein the first storage element asserts the acknowledge signal to indicate that a scan pattern bit of a scan pattern has been shifted into the scan chain.

15. A storage element having a synchronous mode and an asynchronous mode, comprising:
   a first data input;
   a second data input;
   a clock input;
   a request input to receive a storage request signal;
   a storage complete output to provide a storage complete indicator signal; and
   a data output, wherein:
      during operation in the synchronous mode, data values from a selected one of the first data input or second data input are stored into the storage element and provided at the data output synchronous to a clock signal at the clock input, and
      during operation in the asynchronous mode, storage of an input data value at a selected one of the first data input or second data input into the storage element is initiated in response to assertion of the storage request signal, and in response to completing storage of the input data value into the storage element, the storage complete indicator signal is asserted.

16. The storage element of claim 15, wherein the first data input is coupled to receive data values from a first circuit, and the second data input is coupled to receive data values from a second circuit, different from the first circuit.

17. The storage element of claim 16, further comprising a data select input coupled to receive a data select signal, wherein the selected one of the first data input or the second data input is selected in response to the data select signal.

18. The storage element of claim 15, wherein during operation in the asynchronous mode, the clock signal at the clock input is held at a predetermined value.

19. The storage element of claim 15, wherein, during asynchronous mode, upon completing storage of the input data value, the input data value is provided at the data output.

* * * * *